(12) United States Patent
Chang et al.

(10) Patent No.: US 10,461,023 B2
(45) Date of Patent: Oct. 29, 2019

(54) SEMICONDUCTOR PACKAGES AND METHODS OF FORMING THE SAME

(71) Applicant: Taiwan Semiconductor Manufacturing Co., Ltd., Hsinchu (TW)

(72) Inventors: Mao-Yen Chang, Kaohsiung (TW); Hao-Yi Tsai, Hsinchu (TW); Kuo-Lung Pan, Hsinchu (TW); Tin-Hao Kuo, Hsinchu (TW); Tzung-Hui Lee, New Taipei (TW); Teng-Yuan Lo, Hsinchu (TW); Hao-Chun Ting, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/884,357

(22) Filed: Jan. 30, 2018

(65) Prior Publication Data
US 2019/0131223 A1     May 2, 2019

Related U.S. Application Data

(60) Provisional application No. 62/578,534, filed on Oct. 30, 2017.

(51) Int. Cl.
| | |
|---|---|
| *H01L 23/498* | (2006.01) |
| *H01L 23/31* | (2006.01) |
| *H01L 21/48* | (2006.01) |
| *H01L 25/10* | (2006.01) |

(52) U.S. Cl.
CPC .... *H01L 23/49822* (2013.01); *H01L 21/4857* (2013.01); *H01L 23/3128* (2013.01); *H01L 23/49816* (2013.01); *H01L 23/49838* (2013.01); *H01L 23/49866* (2013.01); *H01L 25/105* (2013.01); *H01L 2225/1058* (2013.01)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2008/0081457 A1* | 4/2008 | Lin .................. H01L 21/76816 438/614 |

* cited by examiner

*Primary Examiner* — Long Pham
(74) *Attorney, Agent, or Firm* — JCIPRNET (57) ABSTRACT

Semiconductor package s and methods of forming the same are disclosed. The semiconductor package includes a chip, a redistribution circuit structure and a UBM pattern. The redistribution circuit structure is disposed over and electrically connected to the chip and includes a topmost conductive pattern. The UBM pattern is disposed over and electrically connected to the topmost conductive pattern, wherein the UBM pattern includes a set of vias and a pad on the set of vias, wherein the vias are arranged in an array and electrically connected to the pad and the topmost conductive pattern.

20 Claims, 9 Drawing Sheets

SEMICONDUCTOR PACKAGES AND METHODS OF FORMING THE SAME

CROSS-REFERENCE TO RELATED APPLICATION

This application claims the priority benefit of U.S. provisional application Ser. No. 62/578,534, filed on Oct. 30, 2017. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. The integrated fan-out packages typically include a redistribution circuit structure laying over the molded integrated circuit devices such that the integrated circuit devices may be accessed.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1:
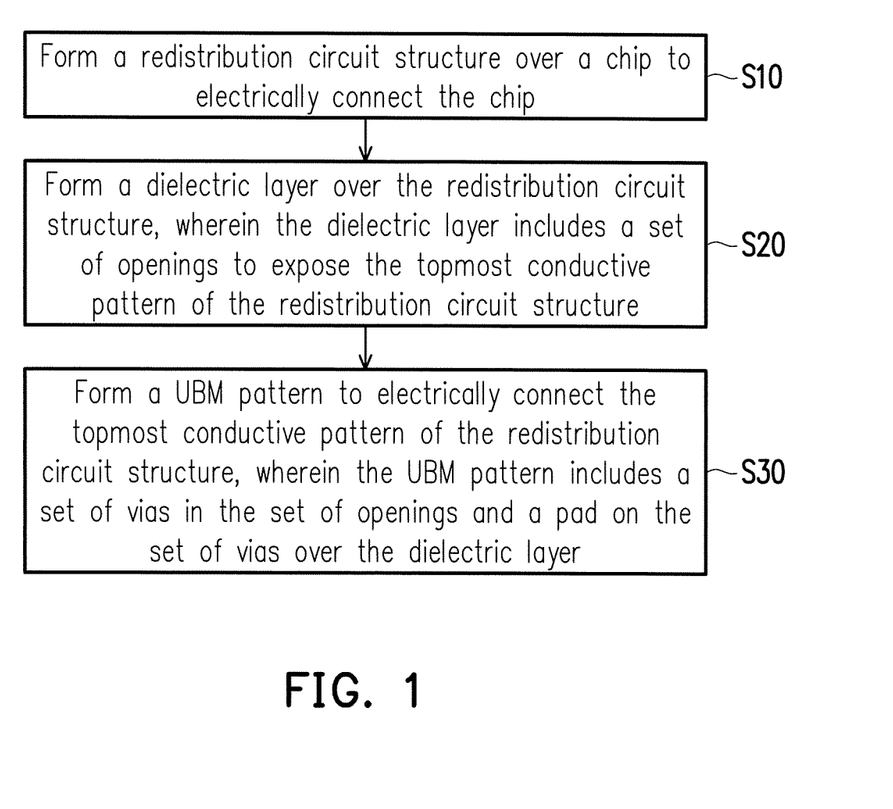
FIG. 1 illustrates a flow chart illustrating a method of forming a semiconductor package in accordance with some embodiments of the present disclosure.
Figure 2A:
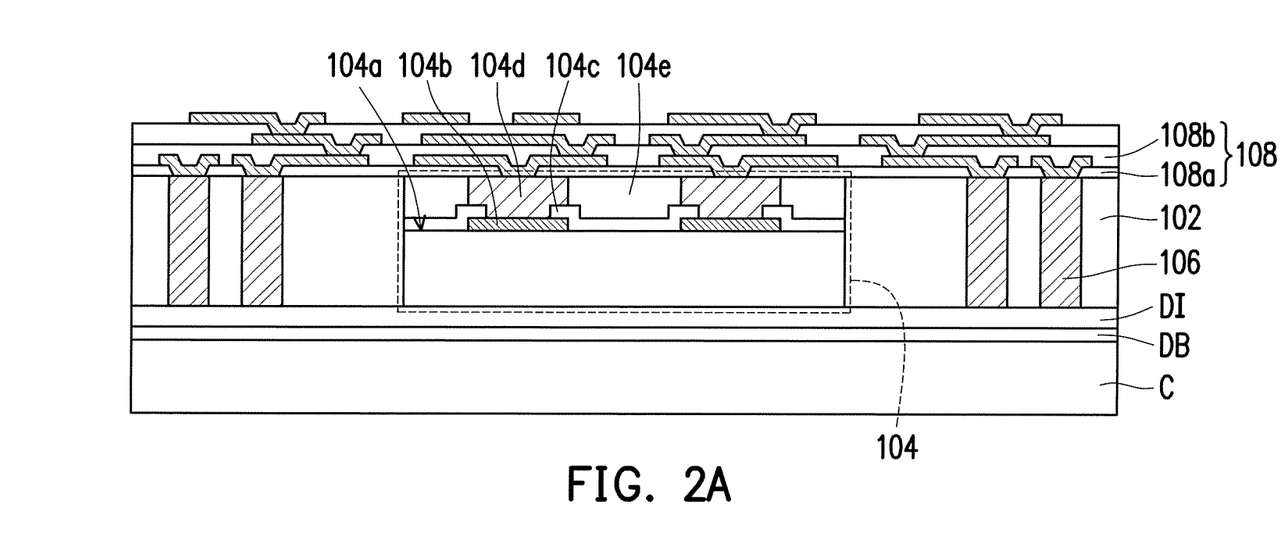
FIGS. 2A-2E are schematic cross-sectional views illustrating a method of forming a semiconductor package in accordance with some embodiments of the disclosure.
Figure 2B:
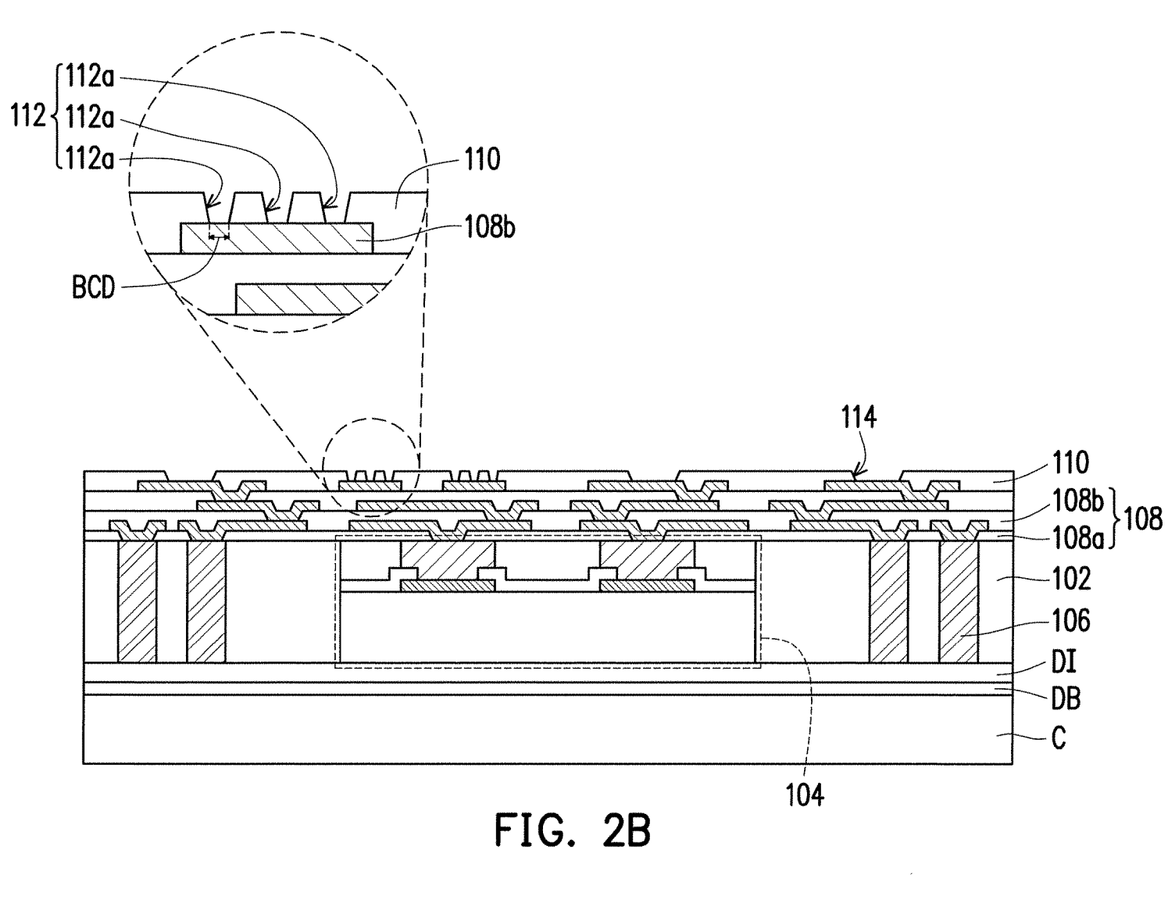

FIG. 1 illustrates a flow chart illustrating a method of forming a semiconductor package in accordance with some embodiments of the present disclosure. FIGS. 2A-2F are schematic cross-sectional views illustrating a method of forming a semiconductor package in accordance with some embodiments of the disclosure. Referring to FIGS. 1 and 2A, at step S10, a redistribution circuit structure 108 is formed over a chip 104 to electrically connect the chip 104. In some embodiments, the chip 104 is formed over a carrier C. A de-bonding layer DB and a dielectric layer DI are stacked over the carrier C in sequential order. In some embodiments, the de-bonding layer DB is formed on the upper surface of the carrier C, and the de-bonding layer DB is between the carrier C and the dielectric layer DI. The carrier C is, for example, a glass substrate. On the other hand, in some embodiments, the de-bonding layer DB is a light-to heat-conversion (LTHC) release layer formed on the glass substrate. In some embodiments, the dielectric layer DI is, for example, polymer such as polyimide, benzocyclobutene (BCB), polybenzoxazole (PBO), or the like. In some alternative embodiments, the dielectric layer DI may include non-organic dielectric materials such as silicon oxide, silicon nitride, silicon carbide, silicon oxynitride, or the like. However, the materials of the de-bonding layer DB, the carrier C, and the dielectric layer DI are merely for illustration, and the disclosure is not limited thereto.

A plurality of conductive posts 102 and the chip 104 are provided over the dielectric layer DI. The chip 104 is mounted onto the dielectric layer DI having the conductive posts 102 formed thereon. A die attach film (DAF) (not shown) is locate between the chip 104 and the dielectric layer DI for adhering the chip 104 onto the dielectric layer DI. The chip 104 is surrounded by the conductive posts 102. The chip 104 is, for example, a semiconductor die. The chip 104 may be a logic device die such as a Central Processing Unit (CPU) die, a Micro Control Unit (MCU) die, a Graphic Processing Unit (GPU) die, a mobile application die, or the like. The chip 104 includes a semiconductor substrate (not shown) and integrated circuit devices (such as active devices, which may include transistors and/or diodes, for example) in and/or on the semiconductor substrate. The chip 104 may further include an active surface 104*a*, a plurality of pads 104*b* distributed on the active surface 104*a*, a dielectric layer 104*c* covering the active surface 104*a*, a plurality of conductive pillars 104*d*, and a protection layer 104*e*. The pads 104*b* are partially exposed by the dielectric layer 104*c*, the conductive pillars 104*d* are disposed on and electrically connected to the pads 104*b*, and the protection layer 104*e* covers the conductive pillars 104*d* and the dielectric layer 104*c*. The conductive pillars 104*d* are copper pillars or other suitable metal pillars, for example. In some embodiments, the protection layer 104*e* may be a polybenzoxazole (PBO) layer, a polyimide (PI) layer or other suitable polymers. In some alternative embodiments, the protection layer 104*e* may be made of inorganic materials.

The chip 104 is encapsulated (molded) in an encapsulating material 106, which surrounds the chip 104. The encapsulating material 106 is formed on the dielectric layer DI to encapsulate the conductive posts 102 and the chip 104. The encapsulating material 106 may include a molding compound, a molding underfill, a resin, an epoxy, and/or the like. The bottom surface of the encapsulating material 106 may be leveled with the bottom end of the chip 104. The top surface of the encapsulating material 106 may be level with or higher than the back surface 108A of the chip 104.

The redistribution circuit structure 108 electrically connected to the conductive pillars 104*d* of the chip 104 and the conductive posts 102 is formed on the top surfaces of the conductive posts 102, the top surface of the encapsulating material 106, the top surfaces of the conductive pillars 104*d*, and the top surface of the protection layer 110*e*. As shown in FIG. 2A, the redistribution circuit structure 108 includes a plurality of inter-dielectric layers 108*a* and a plurality of redistribution conductive patterns 108*b* stacked alternately. The redistribution conductive patterns 108*b* are electrically connected to the conductive pillars 104*d* of the chip 104 and the conductive posts 102 embedded in the encapsulating material 106. In some embodiments, the top surfaces of the conductive pillars 104*d* and the top surfaces of the conductive posts 102 are in contact with the bottommost redistribution conductive patterns 108*b* of the redistribution circuit structure 108. The top surfaces of the conductive pillars 104*d* and the top surfaces of the conductive posts 102 are partially covered by the bottommost inter-dielectric layer 108*a*. The topmost conductive patterns 108*b* are exposed.

Figure 2C:
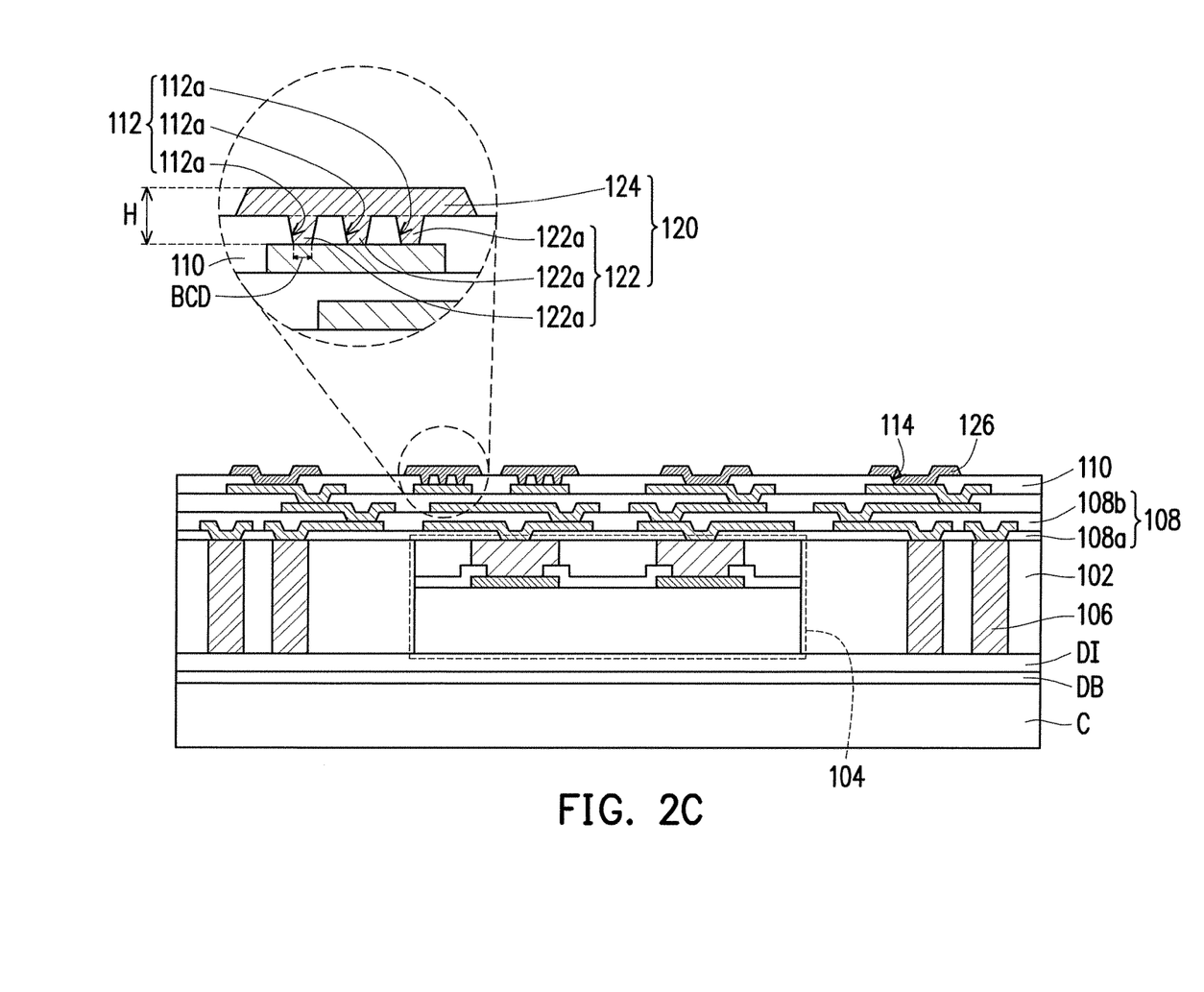
Figure 3A:
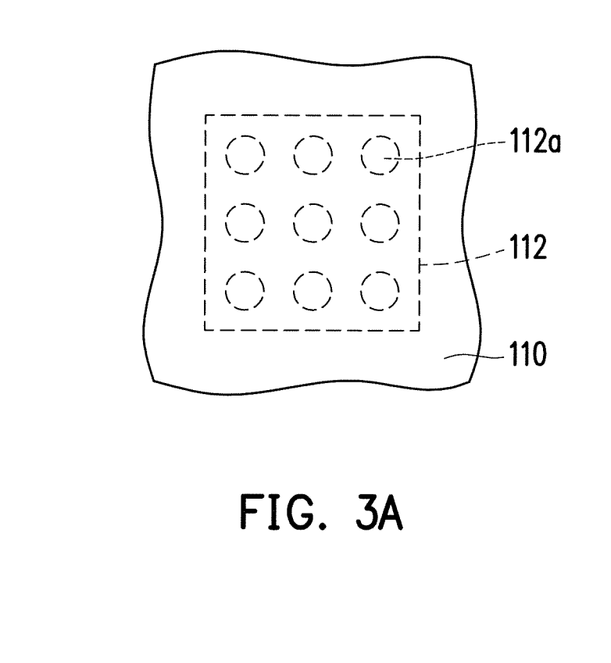
FIG. 3A is a simplified top view of a set of openings in accordance with some embodiments of the present disclosure.

FIG. 3A is a simplified top view of a set of openings in accordance with some embodiments of the present disclosure. Referring to FIGS. 1, 2C and 3A, at step S20, a dielectric layer 110 is formed over the redistribution circuit structure 108, and the dielectric layer 110 includes a set of openings 112 to expose the topmost conductive pattern 108*b* of the redistribution circuit structure 108. In some embodiments, a plurality of sets of openings 112 are formed in the dielectric layer 110 to expose the topmost conductive patterns 108*b* correspondingly. Each set of openings 112 includes a plurality of openings 112*a*, and each set of openings 112 is directly on one topmost conductive pattern 108*b*. The openings 112*a* penetrate the dielectric layer 110. In other words, one topmost conductive pattern 108*b* is exposed through one set of openings 112. As shown in FIG. 3A, in some embodiments, in one set of the openings 112, the openings 112*a* are arranged in an array containing a plurality of columns and a plurality of rows, and number of the columns and may be the same or different from number of the rows. In FIG. 3A, 3×3 array for arranging the openings 112*a* is shown, and the disclosure is not limited thereto. In some embodiments, shapes of the openings 112*a* are the same. In some alternative embodiments, shapes of the openings 112*a* may be different. In some embodiments, top shapes of the openings 112*a* include circle, regular polygon (triangle, square and etc.), or other suitable shapes. In some embodiments, sizes (i.e., diameter) of the openings 112*a* are the same. In some alternative embodiments, sizes of the openings 112*a* may be different. In some embodiments, the bottom critical dimension BCD of the opening 112*a* is less than 25 for example. In some alternative embodiments, the bottom critical dimension BCD of the opening 112*a* is less than 20 for example. In some embodiments, a plurality of openings 114 are formed to expose some of the topmost conductive patterns 108*b* correspondingly. In some embodiments, the dielectric layer 110 is, for example, polymer such as polyimide, benzocyclobutene (BCB), polybenzoxazole (PBO), or the like. In some alternative embodiments, the dielectric layer 110 may include non-organic dielectric materials such as silicon oxide, silicon nitride, silicon carbide, silicon oxynitride, or the like. In some embodiments, the openings 112*a*, 114 are formed by removing portions of the dielectric layer 110 by a wet etching process or a dry etching process.

Figure 3B:
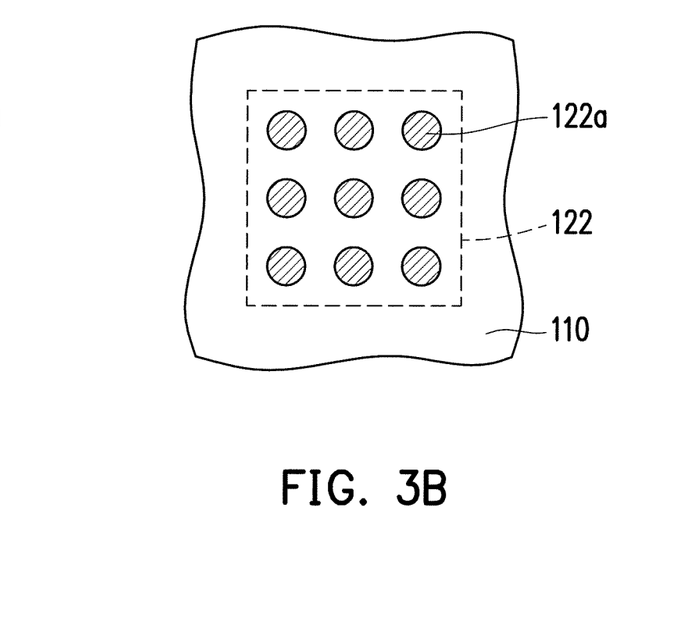
FIG. 3B is a simplified top view of a set of vias in accordance with some embodiments of the present disclosure.

FIG. 3B is a simplified top view of a set of vias in accordance with some embodiments of the present disclosure. Referring to FIGS. 1, 2C and 3B, at step S30, a under-ball metallurgy (UBM) pattern 120 is formed to electrically connect the topmost conductive pattern 108*b* of the redistribution circuit structure 108, and the UBM pattern includes a set of vias 122 in the set of openings 112 and a pad 124 on the set of vias 122 over the dielectric layer 110. In some embodiments, a plurality of UBM patterns 120 are formed in the plurality of sets of openings 112, to electrically connect the topmost conductive patterns 108*b* respectively. Each UBM pattern 120 includes a set of vias 122 and a pad 124 disposed on and electrically connected to the set of vias 122. In some embodiments, the set of vias 122 is disposed in and fills the set of openings 112. That is, the plurality of vias 122*a* are disposed in and fill the plurality of openings 112*a* respectively. One set of vias 122 is directly disposed between and electrically connected to the topmost conductive pattern 108*b* and the pad 124. Therefore, the UBM pattern 120 is electrically connected to the topmost conductive pattern 108*b* through one set of vias 122. As shown in FIG. 3B, in some embodiments, in one set of the vias 122, the vias 122*a* are arranged in an array containing a plurality of columns and a plurality of rows, and number of the columns and may be the same or different from number of the rows. In FIG. 3A, 3×3 array for arranging the vias 122*a* is shown, and the disclosure is not limited thereto. In some embodiments, shapes of the vias 122*a* are the same. In some alternative embodiments, shapes of the vias 122*a* may be different. In some embodiments, top shapes of the vias 122*a* include circle, regular polygon (triangle, square and etc.), or other suitable shapes. In some embodiments, sizes (i.e., diameter) of the vias 122*a* are the same. In some alternative embodiments, sizes of the vias 122*a* may be different. In some embodiments, the bottom critical dimension BCD of the via 122*a* is less than 25 µm, for example. In some alternative embodiments, the bottom critical dimension BCD of the via 122*a* is less than 20 µm, for example. In some embodiments, the vias 122*a* penetrate the dielectric layer 110, and the set of vias 122 is in contact with the topmost conductive pattern 108*b*. In some embodiments, the set of vias 122 is disposed directly on, that is, the set of vias 122 is overlapped with the topmost conductive pattern 108*b*. In some embodiments, the UBM pattern 120 is formed by forming a conductive layer (not shown) on the dielectric layer 110 to fill in one set of openings 112 to form one set of vias 122 and then patterning a portion of the conductive layer on the dielectric layer 110 to form the pad 124. In some embodiments, the UBM pattern 120 is formed by bright copper (Cu) plating, and thus the UBM pattern 120 includes bright copper, for example. In general, a grain size in the material of the via 122*a* is smaller than a grain size in the material of the pad 124, for example. That is, the via 122*a* has a smooth surface and the pad 124 has a rough surface. However, the UBM pattern 120 may include other suitable metals such as titanium, nickel, gold, palladium, alloys thereof and/or multi-layer thereof.

In some embodiments, a plurality of UBM patterns 126 may be formed in the openings 114 respectively for connecting conductive terminals such as solder balls. The UBM patterns 126 may be formed simultaneously with or separately from the UBM patterns 120. In some embodiments, the UBM pattern 126 has a concave surface, for example. Generally, an improper ratio of a total height of the dielectric layer 110 and the pad (such as a portion of the UBM pattern 126 on the dielectric layer 110) to the bottom critical dimension of the via (such as a portion of the UBM pattern 126 in the dielectric layer 110) may cause the incomplete filling of the via and thus a concave surface of the pad (such as the concave surface of the UBM pattern 126). On contrary, in some embodiments, a ratio of a total height H of the dielectric layer 110 and the pad 124 to the bottom critical dimension BCD of the via 122*a* (i.e., the opening 106*a*) is equal to or larger than 0.2 (i.e., H/D=0.2 or H/D>0.2), for example. Therefore, the via 122*a* may fill the opening 112*a* completely, and the pad 124 has a substantially flat surface. Accordingly, the set of vias 122 provides a good connection between the pad 124 and the topmost conductive pattern 108*b*. The number of the UBM patterns 120, 126 and the vias 122*a* of the UBM patterns 120 is not limited in this disclosure.

Figure 2D:
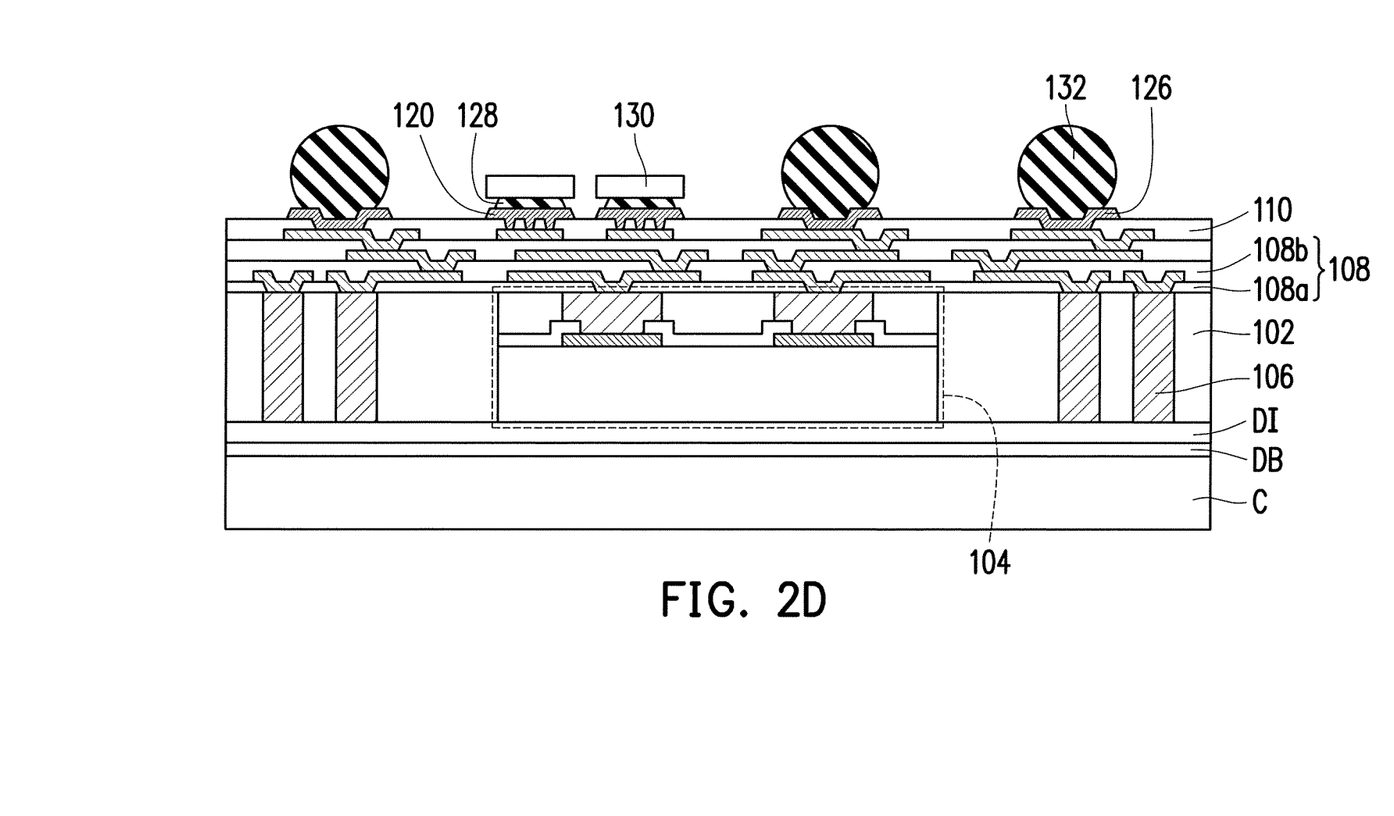

Referring to FIG. 2D, a plurality of passive component 130 is formed on the UBM patterns 120 through solder regions 128 respectively. The solder regions 128 are formed on the UBM patterns 120 respectively. Then, a passive component 130 is mounted on the UBM pattern 120 through the solder region 128. In some embodiments, after bonding to the passive component 130, a reflow process is performed. Conventionally, a cavity may be formed in the solder region since the UBM pattern has a significant concave surface, and the cavity may be burst, which causes regulatory affairs issue. In some embodiments, since the UBM pattern 120 has a substantially flat surface, a cavity is prevented from being formed in the solder region 128. Accordingly, the package has a good reliability. In some embodiments, conductive terminals 132 such as solder balls are formed on the UBM patterns 126 respectively. The conductive terminals 132 may be formed through a ball placement process or other suitable processes. In some embodiments, the conductive terminals 132 and the solder regions 128 may be formed simultaneously or separately. In some embodiments, the passive component 130 is bonded to one UBM pattern 120, and the disclosure is not limited thereto. In some alternative embodiments, the passive component 130 may be bonded to more than one UBM patterns 120.

In some embodiments, the passive component 130 is a discrete passive device that is not formed in a same chip in which the active devices such as transistors and diodes are formed. Accordingly, the passive component 130 may be free from active devices built therein. The passive component 130 is also sometimes referred to as a Surface Mount Device (SMD) since the passive device is mounted on the surface of other package components, rather than being built in the same chip in which the active devices are formed. In some embodiments, the passive component 130 has a plurality of terminals (not shown), through which the passive component 130 is electrically connected to the UBM patterns 120. In some embodiments, the passive component 130 is a capacitor, an inductor, a resistor, or another type of passive device. The passive component 130 may be silicon based, wherein the passive device therein is formed starting from a semiconductor substrate such as silicon substrate. The passive component 130 may also be ceramic based. The passive component 130 may be used to tune the performance of the respective PoP structure.

Figure 2E:
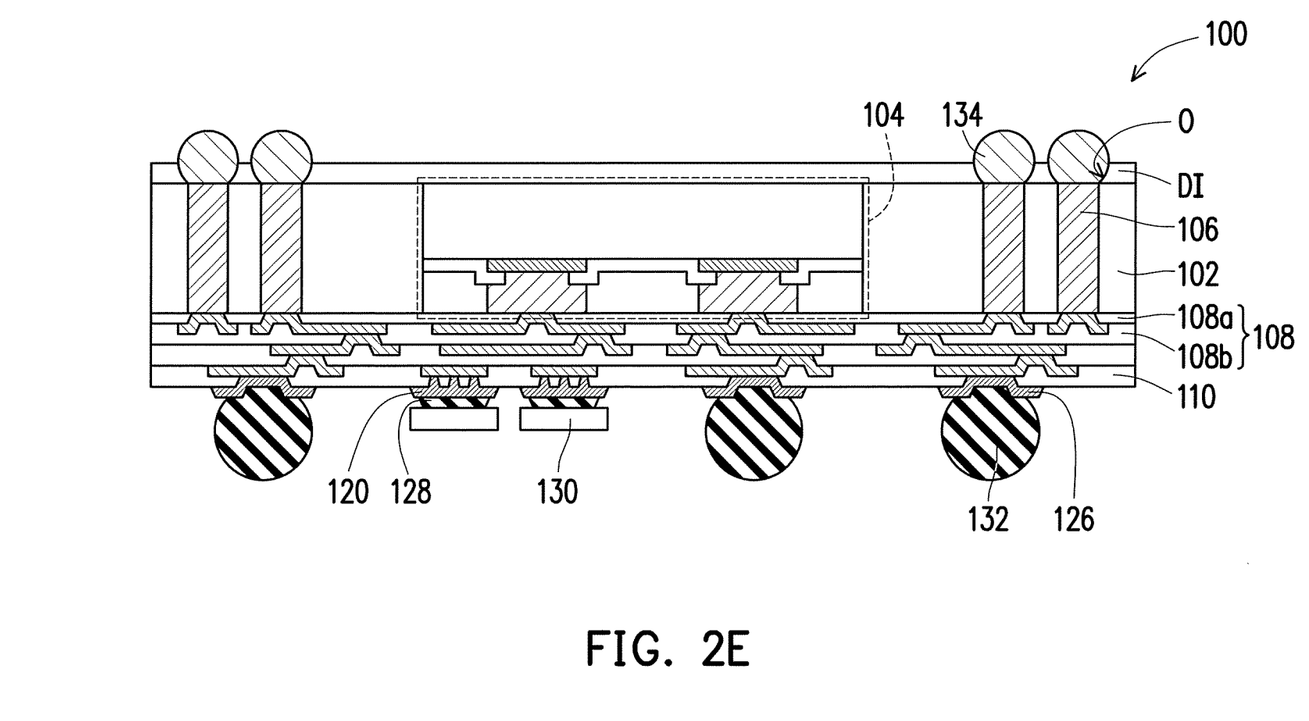

Referring to FIG. 2E, after the passive component 130 and the conductive terminals 132 are mounted on the redistribution circuit structure 108, the dielectric layer DI formed on the bottom surface of the encapsulating material 106 is de-bonded from the de-bonding layer DB such that the dielectric layer DI is separated from the carrier C. That is, the carrier C is removed. In some embodiments, the de-bonding layer DB (e.g., the LTHC release layer) may be irradiated by an UV laser such that the dielectric layer DI adhered on the bottom surface of the encapsulating material 106 is peeled from the carrier C. As illustrated in FIG. 2E, the dielectric layer DI is then patterned such that a plurality of contact openings O is formed to partially expose the conductive posts 102. The number of the contact openings O corresponds to the number of the conductive posts 102. In some embodiments, the contact openings O of the dielectric layer DI are formed by a laser drilling process, a mechanical drilling process, or other suitable processes.

After the contact openings O are formed in the dielectric layer DI, a plurality of conductive terminals 134 are placed in the contact openings O, and the conductive terminals 134 are electrically connected to the conductive posts 102. As illustrated in FIG. 2E, after the conductive terminals 132 and the conductive terminals 134 are formed, an integrated fan-out (INFO) packages 10 having dual-side terminal design is substantially completed. In some alternative embodiments, an INFO package array may be formed, and the INFO package array is diced to form a plurality of INFO packages. In some alternative embodiments, the dicing process or singulation process typically involves dicing with a rotating blade or a laser beam. In other words, the dicing or singulation process is, for example, a laser cutting process, a mechanical cutting process, or other suitable processes.

Figure 2F:
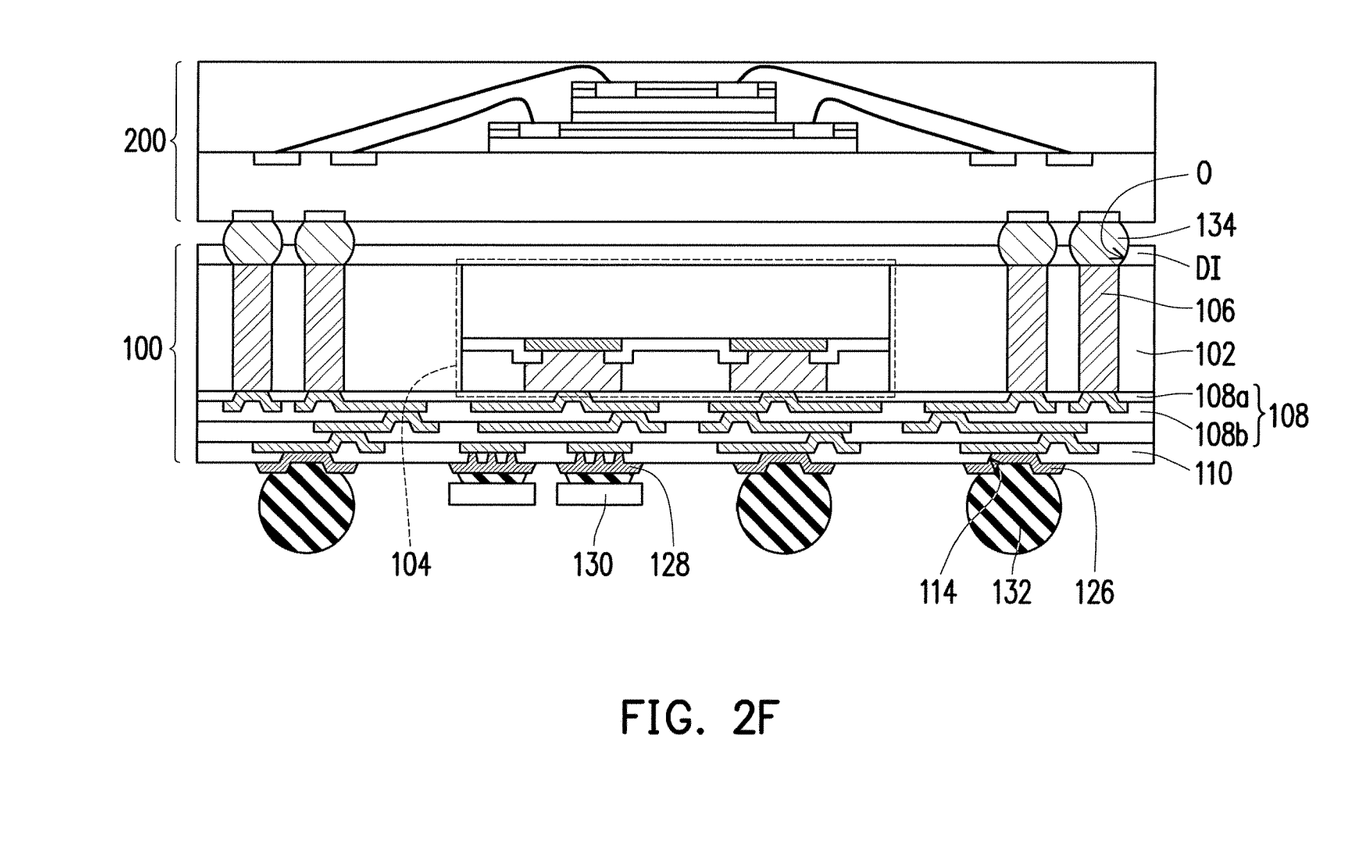
FIG. 2F is a cross-sectional view illustrating a package-on-package (POP) structure in accordance with some embodiments of the disclosure.

FIG. 2F is a cross-sectional view illustrating a package-on-package (POP) structure in accordance with some embodiments of the disclosure. In some embodiments, the INFO package 100 may be stack with other electronic devices. For example, referring to FIG. 2F, another package 200 is provided. The package 200 is, for example, an IC package. The package 200 is stacked over and electrically connected to the INFO package 100 through the conductive terminals 134 such that the package-on-package (POP) structure is fabricated. It should be noted that FIG. 2F merely serves as an exemplary illustration, and the disclosure is not limited thereto. In some alternative embodiments, the INFO package 100 may be stacked with other electronic devices such as another INFO package, a memory device, a ball grid array (BGA), or a wafer. Furthermore, in an example of forming the INFO package array, the stacking may be performed preceding the dicing process. For example, the INFO package may be stacked with a wafer, and the singulation process may be performed on the stacked INFO package array and the wafer simultaneously.

Figure 4:
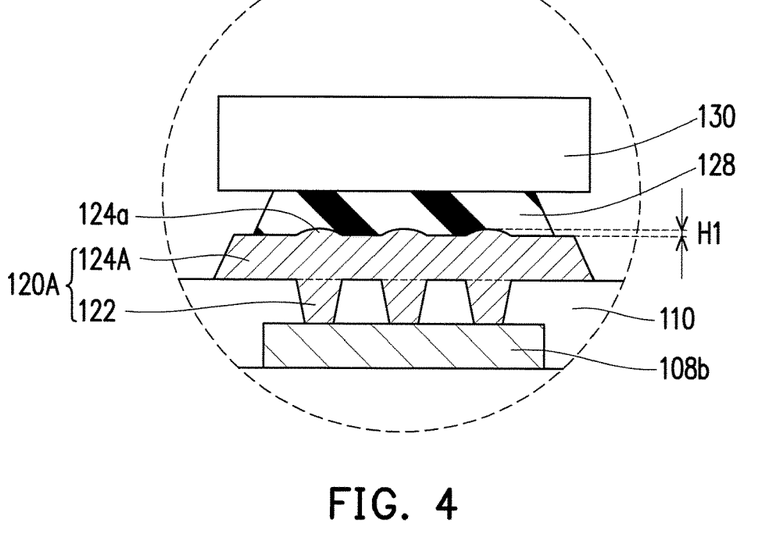
FIG. 4 is a schematic cross-sectional views illustrating a portion of a semiconductor package in accordance with some embodiments of the disclosure.

FIG. 4 is a schematic cross-sectional views illustrating a portion of a semiconductor package in accordance with some embodiments of the disclosure. In FIG. 4, a UBM pattern 120A similar to the UBM pattern 120 as shown in FIG. 2C is described, except the top surface of a pad 124A of an UBM pattern 120A includes at least one convex portion 124a corresponding to a set of vias 122. In some embodiments, a height H1 of the convex portion 126a is smaller than 15% of the total height of the pad 124A. In some embodiments, the height H1 of the convex portion 126a is smaller than 1 μm with respect to an average surface of the pad 124. In other words, the UBM pattern 120A has a substantially flat surface on which a solder region 128 is formed, and thus a cavity is prevented from forming in the solder region 128. Accordingly, a joint between a passive component 130 and the UBM pattern 120A is improved.

Figure 5:
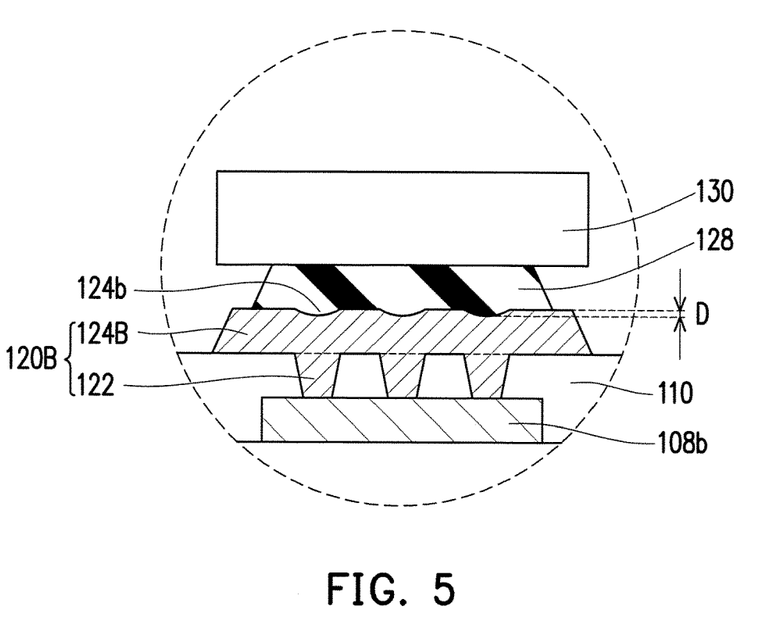
FIG. 5 is a schematic cross-sectional views illustrating a portion of a semiconductor package in accordance with some embodiments of the disclosure.

FIG. 5 is a schematic cross-sectional views illustrating a portion of a semiconductor package in accordance with some embodiments of the disclosure. In FIG. 5, a UBM pattern 120B similar to the UBM pattern 120 as shown in FIG. 2C is described, except the top surface of a pad 124B of an UBM pattern 120B includes at least one concave portion 124b corresponding to a set of vias 122. In some embodiments, a depth D of the convex portion 126a is smaller than 15% of the total height of the pad 124A. In some embodiments, the depth D of the concave portion 124b is smaller than 1 μm with respect to an average surface of the pad 124. In other words, the UBM pattern 120B has a substantially flat surface on which a solder region 128 is formed, and thus a cavity is prevented from forming in the solder region 128. Accordingly, a joint between a passive component 130 and the UBM pattern 120B is improved.

In some embodiments, the UBM pattern includes a set of vias arranged in an array and a pad disposed on and electrically connecting to the set of vias. Therefore, the UBM pattern may have a substantially flat and smooth surface, on which a depth of a concave portion or a height of a convex portion is less than 1 μm if present. Accordingly, the solder region formed on the UBM pattern is prevented from forming a cavity therein, which would be inspected by the x-ray inspection or burst to cause pressure violently variation during torture test. In other words, quality assurance or regulatory affairs issues caused by the cavity in the solder region between the UBM pattern and the passive component are prevented. In addition, the passive component can be jointed to the UBM pattern easily due to the smooth surface of the UBM pattern, and the stress between the pad of the UBM pattern and the topmost conductive pattern is lowered. Therefore, joint between the UBM pattern and the passive component can be improved, and the performance of the package can be also improved.

In accordance with some embodiments of the disclosure, a semiconductor package includes a chip, a redistribution circuit structure and a UBM pattern. The redistribution circuit structure is disposed over and electrically connected to the chip and includes a topmost conductive pattern. The UBM pattern is disposed over and electrically connected to the topmost conductive pattern, wherein the UBM pattern includes a set of vias and a pad on the set of vias, wherein the vias are arranged in an array and electrically connected to the pad and the topmost conductive pattern.

In accordance with alternative embodiments of the disclosure, a semiconductor package includes a chip, a conductive pattern, a dielectric layer and a UBM pattern. The conductive pattern is disposed over and electrically connected to the chip. The dielectric layer is disposed over the conductive pattern and includes a set of openings to expose the conductive pattern. The UBM pattern includes a set of vias in the set of openings and a pad on the set of vias, wherein the pad is electrically connected to the conductive pattern through the set of vias, and a ratio of a total height (H) of the dielectric layer and the pad to a bottom critical dimension (BCD) of the via is equal to or larger than 0.2 (H/BCD=0.2 or H/BCD>0.2).

In accordance with yet alternative embodiments of the disclosure, a method of forming a semiconductor package includes the following steps. A conductive pattern of a redistribution circuit structure is formed over a chip to electrically connect the chip. A dielectric layer including a set of openings is formed over the conductive pattern, wherein the set of openings exposes the conductive pattern. A UBM pattern is formed to electrically connect the conductive pattern, wherein the UBM pattern includes a set of vias in the set of openings and a pad on the set of vias over the dielectric layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor package, comprising:
   a chip;
   a redistribution circuit structure, disposed over and electrically connected to the chip and comprising a topmost conductive pattern;
   a under-ball metallurgy (UBM) pattern disposed over and electrically connected to the topmost conductive pattern, wherein the UBM pattern comprises a set of vias and a pad on the set of vias, wherein the vias are arranged in an array and electrically connected to the pad and the topmost conductive pattern;
   a passive component mounted to the redistribution circuit structure through the UBM pattern; and
   a solder region between the UBM pattern and the passive component.

2. The semiconductor package of claim 1, wherein the vias are overlapped with the topmost conductive pattern.

3. The semiconductor package of claim 1, wherein shapes of the vias comprise circle or regular polygon.

4. A semiconductor package, comprising:
   a chip;
   a conductive pattern disposed over and electrically connected to the chip;

a dielectric layer, disposed over the conductive pattern and comprising a set of openings to expose the conductive pattern; and a under-ball metallurgy (UBM) pattern, comprising a set of vias in the set of openings and a pad on the set of vias, wherein the pad is electrically connected to the conductive pattern through the set of vias, and a ratio of a total height (H) of the dielectric layer and the pad to a bottom critical dimension (BCD) of the via is equal to or larger than 0.2 (H/BCD=0.2 or H/BCD>0.2).

5. The semiconductor package of claim 4, wherein the vias are overlapped with the conductive pattern.

6. The semiconductor package of claim 4, wherein a top surface of the pad comprises at least one convex portion.

7. The semiconductor package of claim 6, wherein a height of the convex portion is smaller than 1 µm.

8. The semiconductor package of claim 4, wherein a top surface of the pad comprises at least one concave portion.

9. The semiconductor package of claim 8, wherein a depth of the concave portion is smaller than 1 µm.

10. The semiconductor package of claim 4, wherein the UBM pattern comprises bright copper.

11. The semiconductor package of claim 4, wherein shapes of the vias comprise circle or regular polygon.

12. The semiconductor package of claim 4 further comprising a passive component mounted to the redistribution circuit structure through the UBM pattern.

13. The semiconductor package of claim 12 further comprising a solder region between the UBM pattern and the passive component.

14. The semiconductor package of claim 1, wherein a top surface of the pad comprises at least one convex portion.

15. The semiconductor package of claim 1, wherein a top surface of the pad comprises at least one concave portion.

16. The semiconductor package of claim 1, wherein the UBM pattern comprises bright copper.

17. A method of forming a semiconductor package, comprising:

forming a conductive pattern of a redistribution circuit structure over a chip to electrically connect the chip;

forming a dielectric layer comprising a set of openings over the conductive pattern, wherein the set of openings exposes the conductive pattern; and forming a under-ball metallurgy (UBM) pattern to electrically connect the conductive pattern, wherein the UBM pattern comprises a set of vias in the set of openings and a pad on the set of vias over the dielectric layer, and a ratio of a total height (H) of the dielectric layer and the pad to a bottom critical dimension (BCD) of the via is equal to or larger than 0.2 (H/BCD=0.2 or H/BCD>0.2).

18. The method of claim 17, wherein a forming method of the UBM pattern comprises bright copper plating.

19. The method of claim 17, wherein the openings are arranged in an array, and the vias are arranged in an array correspondingly.

20. The method of claim 17, further comprising bonding a passive component to the conductive pattern through a solder region therebetween.

* * * * *